(12) United States Patent
Batruni

(10) Patent No.: US 11,580,195 B1
(45) Date of Patent: Feb. 14, 2023

(54) QUANTUM MODULATION-BASED DATA COMPRESSION

(71) Applicant: Roy G. Batruni, Danville, CA (US)

(72) Inventor: Roy Batruni, Danville, CA (US)

(73) Assignee: Roy G. Batruni, Danville, CA (US)

( * ) Notice: Subject to any disclaimer, the term of this patent is extended or adjusted under 35 U.S.C. 154(b) by 347 days.

(21) Appl. No.: 16/827,352

(22) Filed: Mar. 23, 2020

Related U.S. Application Data

(60) Provisional application No. 62/897,738, filed on Sep. 9, 2019.

(51) Int. Cl.

| | |
|---|---|
| *G06F 17/16* | (2006.01) |
| *G06N 10/00* | (2022.01) |
| *G06N 3/02* | (2006.01) |
| *H03M 13/00* | (2006.01) |
| *G06N 10/70* | (2022.01) |

(52) U.S. Cl.
CPC ............... *G06F 17/16* (2013.01); *G06N 3/02* (2013.01); *G06N 10/00* (2019.01); *G06N 10/70* (2022.01); *H03M 13/6312* (2013.01)

(58) Field of Classification Search
CPC ........................... G06F 17/16; G06F 2212/401
See application file for complete search history.

(56) References Cited

U.S. PATENT DOCUMENTS

2014/0133001 A1* 5/2014 da Silva ................. B82Y 10/00
359/107

OTHER PUBLICATIONS

Richard Cleve, David P. DiVincenzo; Schumacher's quantum data compression as a quantum computation; Physical Review A; vol. 54, No. 4; Oct. 1996 (Year: 1996).*
"Bloch sphere", Wikipedia, access Sep. 4, 2019 at URL: https://en.wikipedia.org/wiki/Bloch_sphere.
Mark Riebe, "Preparation of Entangled States and Quantum Teleportation with Atomic Qubits," Dissertation for Doctoral Degree at Leopold-Franzens-University Innsbruck, May 2005.
Philipp Krammer. "Quantum entanglement: Detection, classification, and quantification." Master of Science Thesis, University of Vienna, Oct. 2005.

* cited by examiner

*Primary Examiner* — Joseph D Torres
(74) *Attorney, Agent, or Firm* — Van Pelt, Yi & James LLP

(57) ABSTRACT

Data compression includes: inputting data comprising a vector that requires a first amount of memory; compressing the vector into a compressed representation while preserving information content of the vector, including: encoding, using one or more non-quantum processors, at least a portion of the vector to implement a quantum gate matrix; and modulating a reference vector using the quantum gate matrix to generate the compressed representation, wherein the compressed representation requires a second amount of memory that is less than the first amount of memory; and outputting the compressed representation to be displayed, stored, and/or further processed.

24 Claims, 16 Drawing Sheets

QUANTUM MODULATION-BASED DATA COMPRESSION

CROSS REFERENCE TO OTHER APPLICATIONS

This application claims priority to U.S. Provisional Patent Application No. 62/897,738 entitled QUANTUM MODULATION-BASED DATA CLASSIFICATION filed Sep. 9, 2019 which is incorporated herein by reference for all purposes.

BACKGROUND OF THE INVENTION

Quantum computing is a field that will likely spur new breakthroughs to many areas of science and technology. Traditional processors in classical computers encode information using bits (0s and 1s) to represent data. Quantum processors in quantum computers, on the other hand, encode information using quantum bits (also called qubits) and perform operations according to the principles of quantum mechanics. While a single bit has two possible states, a qubit can exist in superposition (i.e., multiple states at the same time). A qubit is said to be in a coherent state when it is not measured. When measured, it de-coheres to 1 or 0 probabilistically.

A qubit in a coherent state can be visually represented on the surface of an imaginary sphere (referred to as a Bloch sphere). Since there are an infinite number of points on the surface of a Bloch sphere, a qubit in the coherent state in theory can store an infinite amount of information. There are many existing computing problems that require a high amount of data processing, and can benefit from certain properties of quantum computing such as superposition, parallelism, entanglement, etc. For example, customer data sometimes involves millions of records, with each record having thousands or tens of thousands of attributes. Training machine learning models to do classification or prediction on such data often requires a huge amount of memory and processing cycles. DNA analysis, which can involve examining millions to billions of base pairs, is another example of a resource intensive computational problem. If quantum computers were more readily available, many of these currently difficult computational problems can be solved exponentially faster than on existing classical computer systems.

Today, most of the quantum computers that have been developed remain experimental. Unlike classical computer processors for which well-established and robust fabrication technology has been developed, the devices used to implement quantum computers, such as ion traps, super conductors, photon-transistors, etc., remain fragile and expensive to build. Further, due to the fundamental differences in the operating units of the devices, existing computational techniques used by classical computers cannot be easily reused on quantum computers and new programming techniques need to be developed. It would be useful, however, if some of the quantum computing techniques could be applied to classical computers to reduce resource requirements and improve processing speed, especially for solving computationally intensive problems.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Quantum modulation-based data compression is disclosed. Data comprising a vector that requires a first amount of memory is input. The vector is compressed into a compressed representation while preserving information content of the vector. Compressing the vector into the compressed representation includes encoding, using one or more non-quantum processors, at least a portion of the vector to implement a quantum gate matrix; and modulating a reference vector using the quantum gate matrix to generate the compressed representation, wherein the compressed representation requires a second amount of memory that is less than the first amount of memory. The compressed representation is output to be displayed, stored, and/or further processed.

Figure 1:
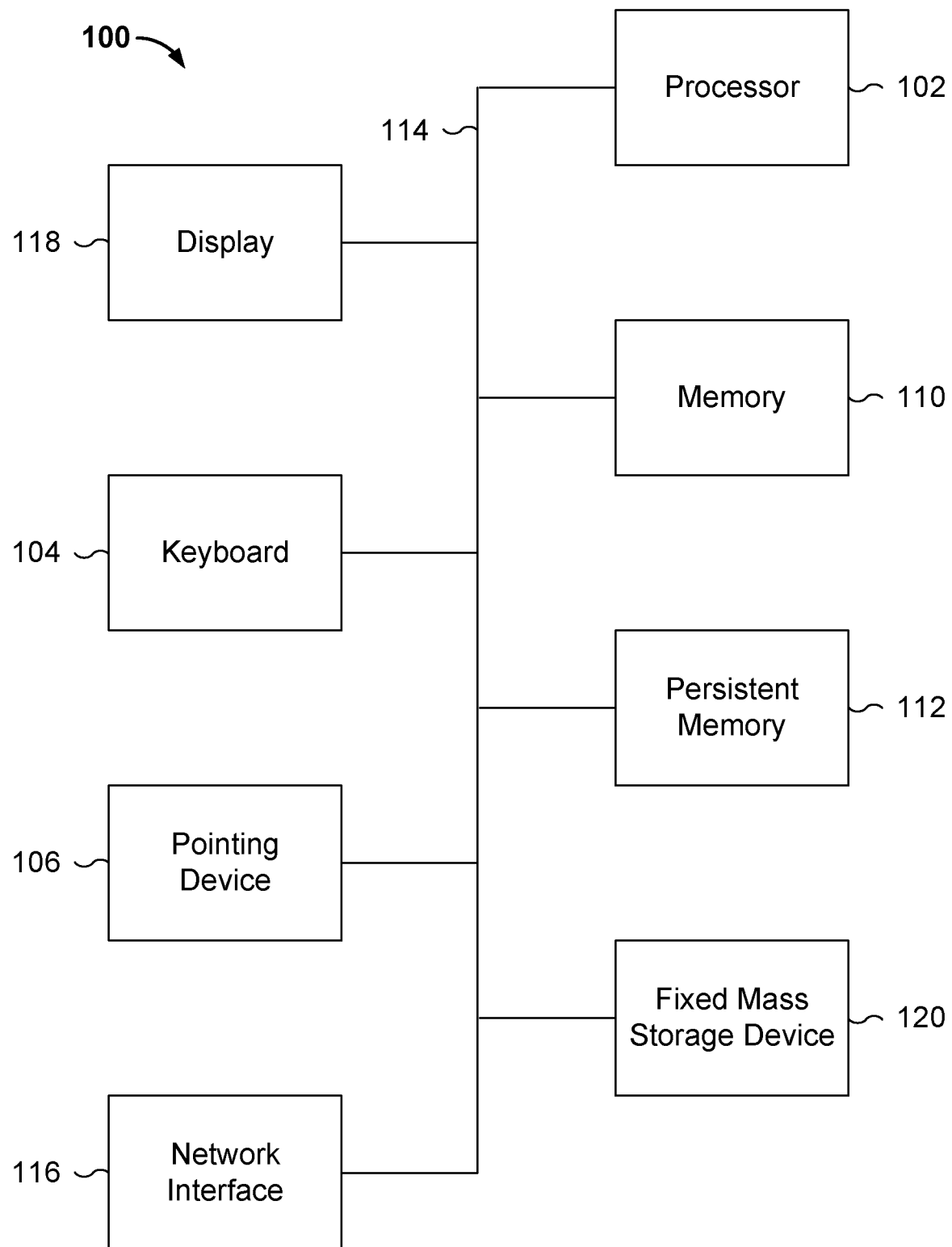
FIG. 1 is a functional diagram illustrating a classical programmed computer system for processing data in accordance with some embodiments.

FIG. 1 is a functional diagram illustrating a classical programmed computer system for processing data in accordance with some embodiments. As will be apparent, other computer system architectures and configurations can be used to perform data processing (e.g., qubit-based data compression). Computer system 100, which includes various subsystems as described below, includes at least one microprocessor subsystem (also referred to as a processor or a central processing unit (CPU)) 102. For example, processor 102 can be implemented by a single-chip processor or by multiple processors. In some embodiments, processor 102 is a general purpose digital processor that controls the operation of the computer system 100. Using instructions retrieved from memory 110, the processor 102 controls the reception and manipulation of input data, and the output and display of data on output devices (e.g., display 118). In some embodiments, processor 102 includes and/or is used to perform qubit-based data processing that ordinarily would have required a quantum computer.

Processor 102 is coupled bi-directionally with memory 110, which can include a first primary storage, typically a random access memory (RAM), and a second primary storage area, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 102. Also as is well known in the art, primary storage typically includes basic operating instructions, program code, data, and objects used by the processor 102 to perform its functions (e.g., programmed instructions). For example, memory 110 can include any suitable computer-readable storage media, described below, depending on whether, for example, data access needs to be bi-directional or uni-directional. For example, processor 102 can also directly and very rapidly retrieve and store frequently needed data in a cache memory (not shown).

A removable mass storage device 112 provides additional data storage capacity for the computer system 100, and is coupled either bi-directionally (read/write) or uni-directionally (read only) to processor 102. For example, storage 112 can also include computer-readable media such as magnetic tape, flash memory, PC-CARDS, portable mass storage devices, holographic storage devices, and other storage devices. A fixed mass storage 120 can also, for example, provide additional data storage capacity. The most common example of mass storage 120 is a hard disk drive. Mass storages 112, 120 generally store additional programming instructions, data, and the like that typically are not in active use by the processor 102. It will be appreciated that the information retained within mass storages 112 and 120 can be incorporated, if needed, in standard fashion as part of memory 110 (e.g., RAM) as virtual memory.

In addition to providing processor 102 access to storage subsystems, bus 114 can also be used to provide access to other subsystems and devices. As shown, these can include a display monitor 118, a network interface 116, a keyboard 104, and a pointing device 106, as well as an auxiliary input/output device interface, a sound card, speakers, and other subsystems as needed. For example, the pointing device 106 can be a mouse, stylus, track ball, or tablet, and is useful for interacting with a graphical user interface.

The network interface 116 allows processor 102 to be coupled to another computer, computer network, or telecommunications network using a network connection as shown. For example, through the network interface 116, the processor 102 can receive information (e.g., data objects or program instructions) from another network or output information to another network in the course of performing method/process steps. Information, often represented as a sequence of instructions to be executed on a processor, can be received from and outputted to another network. An interface card or similar device and appropriate software implemented by (e.g., executed/performed on) processor 102 can be used to connect the computer system 100 to an external network and transfer data according to standard protocols. For example, various process embodiments disclosed herein can be executed on processor 102, or can be performed across a network such as the Internet, intranet networks, or local area networks, in conjunction with a remote processor that shares a portion of the processing. Additional mass storage devices (not shown) can also be connected to processor 102 through network interface 116.

An auxiliary I/O device interface (not shown) can be used in conjunction with computer system 100. The auxiliary I/O device interface can include general and customized interfaces that allow the processor 102 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: magnetic media such as hard disks, floppy disks, and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code, as produced, for example, by a compiler, or files containing higher level code (e.g., script) that can be executed using an interpreter.

The computer system shown in FIG. 1 is but an example of a computer system suitable for use with the various embodiments disclosed herein. Other computer systems suitable for such use can include additional or fewer subsystems. In addition, bus 114 is illustrative of any interconnection scheme serving to link the subsystems. Other computer architectures having different configurations of subsystems can also be utilized.

Figure 2:
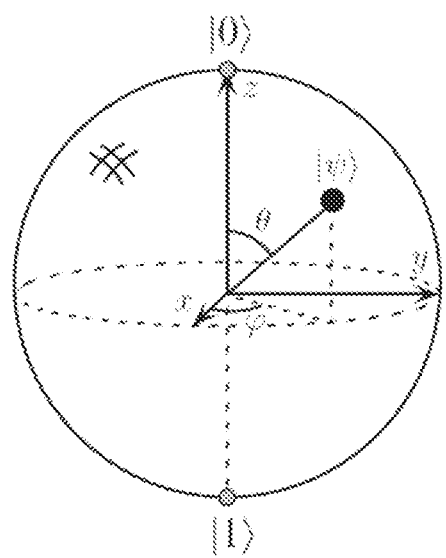
FIG. 2 is a diagram illustrating an example of a Bloch sphere used to represent qubits.

FIG. 2 is a diagram illustrating an example of a Bloch sphere used to represent qubits. The Bloch sphere is a unit 2-sphere, with antipodal points corresponding to a pair of mutually orthogonal state vectors. The north and south poles of the Bloch sphere are typically chosen to correspond to the standard basis vectors $|0\rangle$ and $|1\rangle$, respectively, which in turn can correspond to, for example, the spin-up and spin-down states of an electron. Given an orthonormal basis, any pure state of a two-level quantum system can be written as a superposition of the basis vectors, where the coefficient or amount of each basis vector is a complex number. Thus, a qubit can be represented as:

$$|\alpha\rangle = \begin{bmatrix} \alpha_1 \\ \alpha_2 \end{bmatrix}, \text{where}$$

$$|\alpha_1| + |\alpha_2| = 1, \text{and}$$

$$\alpha_1 = a_1 + b_1 j$$

$$\alpha_2 = a_2 + b_2 j$$

where $a_1$, $b_1$, $a_2$, and $b_2$ are real numbers. Thus, one qubit can be represented using a set of two complex numbers.

A qubit is said to be in a coherent state when it is not measured. When measured, it de-coheres to 1 or 0 with probability $|\alpha_1|^2$ or $|\alpha_2|^2$.

Qubit representation of data is typically used by quantum computer processors which include structures (e.g., ion traps) that hold and manipulate the qubits at the machine level. In examples discussed below, one or more traditional non-quantum computer processors are used to process data represented as qubits. In some embodiments, traditional processing logic and memory structures still hold and manipulate data as regular bits of 0s and 1s at the machine level, but certain data is encoded into qubit representations at a higher level (e.g., in middleware and/or software). In such embodiments, while data is represented using Qubits, the processing of multidimensional data does not require quantum computers/processors. Rather, traditional non-quantum computer processors can be used to preprocess the data into qubits and achieve memory reduction and processing speed gains that result from qubit representation. The preprocessing can take place offline, and the preprocessed result can be stored and retrieved later to perform different types of analysis functions in a short amount of time.

As will be described in greater detail below, using qubit representation reduces memory and processing requirements, and improves data analysis speed. Classification, clustering, and compression can be performed ten times faster or more than using existing techniques.

Figure 3A:
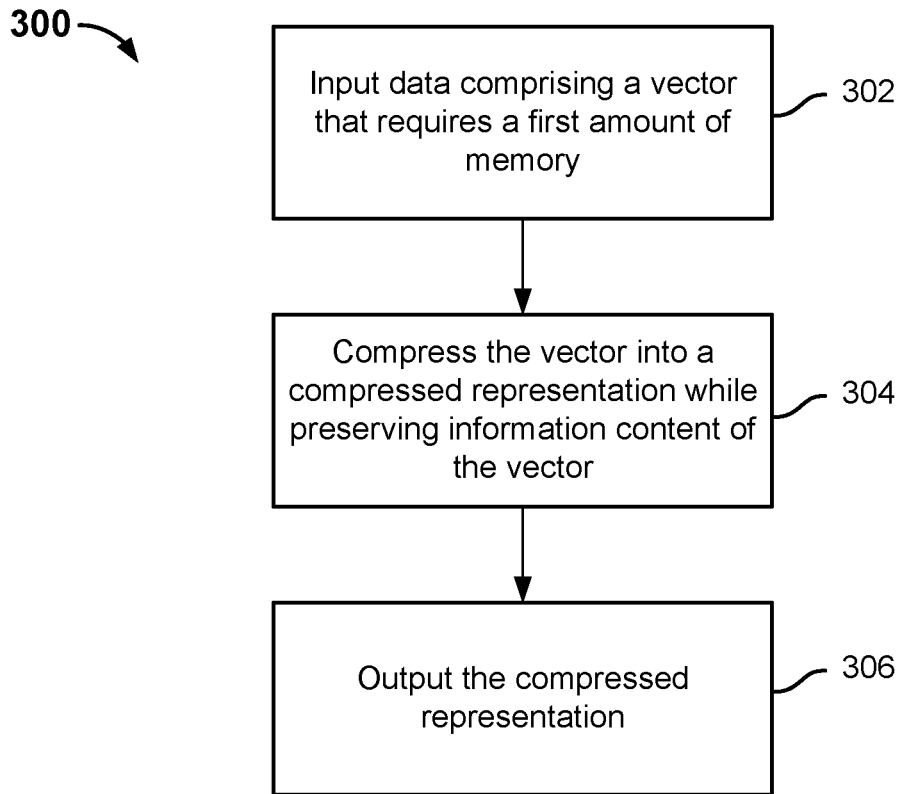
FIG. 3A is a flowchart illustrating an embodiment of a process for performing quantum modulations.

FIG. 3A is a flowchart illustrating an embodiment of a process for performing quantum modulations. As used herein, quantum modulation refers to the process of applying a unitary matrix function (also referred to as a quantum gate) to a reference vector. Process 300 can be performed on a classical computer system such as 100 and does not require a quantum computer.

At 302, data comprising one or more vectors is input. The input data typically represents data associated with real world entities, such as users, objects, etc. In one example, the input data can correspond to customer data. Each vector represents data pertaining to a customer and entries such as characteristics of the customer (e.g., age, income, years residing in a location, etc.), measurements (e.g., average amount of time spent online, average account balance, etc.), etc. There can be many such entries (in this example, 1024 entries representing 1024 characteristics, measurements, etc.). Each input vector requires a first amount of memory, which can be low latency memory such as RAM, DRAM, SRAM, etc., high latency storage such as magnetic or optical disk, flash memory, etc., or a combination. There can be tens of thousands to several million vectors (e.g., representing millions of customers of an online merchant) that are input. While the data can be processed directly by analytics engines such as classifiers and predictors, the amount of memory can be so large that in some cases, the input memory requirement exceeds what the system can handle. In some cases, even though the system is able to process the data in pieces, the processing speed is very slow. Thus, compression is performed to reduce the resource requirement on processing data.

At 304, the vector is compressed to generate a compressed representation. The compressed representation requires substantially less memory as well as fewer processing cycles than the original vector, but still preserves the information content of the vector. In other words, the compression is nearly lossless, and the original vector value can be substantially recovered from the compressed representation. As will be described in greater detail below in connection with FIGS. 4A-4D below, one or more non-quantum processors (e.g., classical semiconductor processors that internally represent data as bits) encode the vector into a quantum gate matrix (also referred to as the unitary matrix or U matrix), then operate the quantum gate matrix on a reference qubit register to generate the compressed representation. The quantum gate matrix can operate on one or more qubits.

At 306, the compressed representation is output. In various embodiments, the compressed data is displayed, stored, and/or further processed. Further processing can be performed by a classifier, a neural network, an atomic network (e.g., a multi-dimensional clustering system as described in U.S. Pat. No. 10,521,458), a machine learning system, or the like.

Figure 3B:
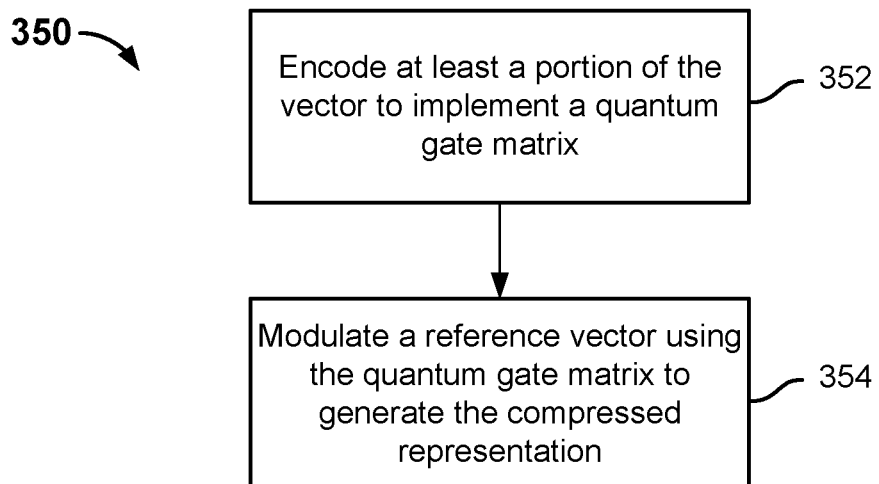
FIG. 3B is a flowchart illustrating an embodiment of a process for compressing a vector.

FIG. 3B is a flowchart illustrating an embodiment of a process for compressing a vector. Process 350 can be used to implement 304 of process 300. One or more non-quantum processors can be used to perform process 350.

At 352, at least a portion of the vector is encoded to implement a quantum gate matrix. In some embodiments, entries from the input vector are input into equation 1 (below) to obtain a quantum gate matrix.

At 354, a reference vector (which can be stored in a reference qubit register) is modulated using the quantum gate matrix to generate the compressed representation. This is also referred to as quantum modulation. In some embodiments, equation 2 (below) is applied. In other embodiments, different modulation techniques can be used. The compressed representation, which can include one or more qubits, requires less memory than the uncompressed vector.

Figure 4A:
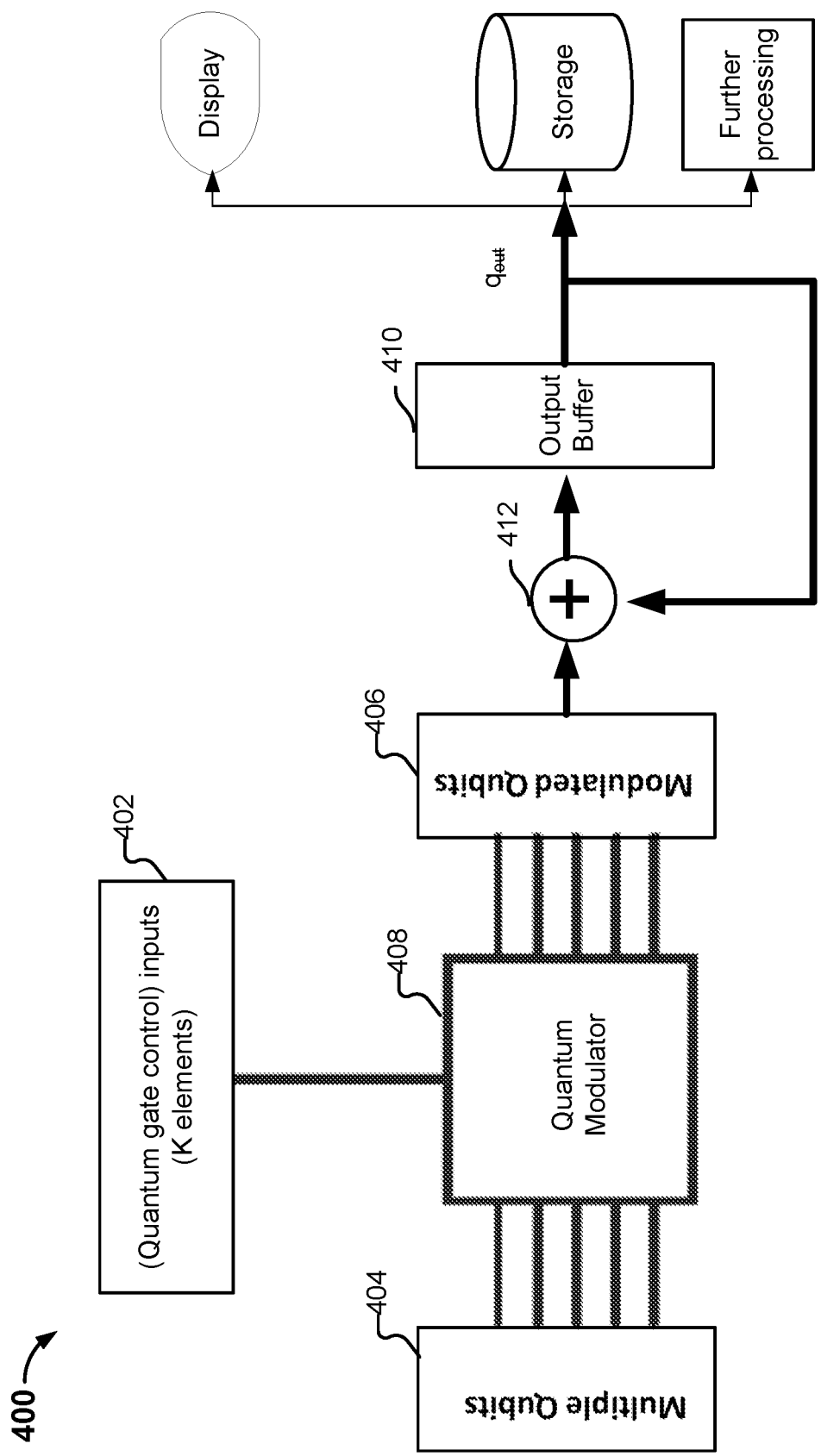
FIG. 4A is a diagram illustrating an embodiment of a system for compression using quantum modulation.

FIG. 4A is a diagram illustrating an embodiment of a system for compression using quantum modulation. As shown, system 400 can be used to perform process 300 as well as process 350.

Registers 402, 404, and 406 include memory or other appropriate storage. The registers are accessible by one or more processors to store data and retrieve the stored data. As shown, registers 402, 404, and 406 store input data, the reference qubits, and output data, respectively.

Input data 402, which includes a vector having K elements expressed as $V_{in}=[v_1 \, v_2 \, v_3 \, \ldots \, v_K]$, is also referred to as the quantum gate control input as it controls how quantum modulator (also referred to as quantum gate) 408 operates. The values of the data are normalized to between 0 and $2\pi$ (also referred to as parameterized by K angles) and are used to implement a unitary matrix U of quantum modulator 408.

Quantum modulator 408 is implemented using a combination of memory and logic circuitry to simulate the operations of a real quantum processor and modulate the reference qubit in register 404. In this example, quantum modulator 408 is implemented using memory that stores a 2x2 unitary matrix U defined as:

$$U = e^{-j\alpha/2} \begin{bmatrix} e^{-j\beta/2} & 0 \\ 0 & e^{-j\beta/2} \end{bmatrix} \begin{bmatrix} \cos(\gamma/2) & -\sin(\gamma/2) \\ \sin(\gamma/2) & \cos(\gamma/2) \end{bmatrix} \begin{bmatrix} e^{-j\delta/2} & 0 \\ 0 & e^{-j\delta/2} \end{bmatrix} \quad \text{(equation 1)}$$

where $\alpha$, $\beta$, $\gamma$, and $\delta$ are set to four elements from the input data. Initially, the values are set to be the first four elements of the input vector. That is, $\alpha=v_1$, $\beta=v_2$, $\gamma=v_3$, and $\delta=v_4$. In some embodiments, normalization is performed where the elements are multiplied with corresponding normalization coefficients. The values $\alpha$, $\beta$, $\gamma$, and $\delta$ correspond to the angular rotation to the input data as the input data is mapped onto a Bloch sphere. Stated another way, the first four elements of the input vector are encoded to implement a quantum gate unitary matrix. The unitary matrix simulates the behavior of a quantum gate because it modifies state probabilities and is reversible (in other words, one can know the input state from the output state because the matrix is invertible). Other quantum gate implementations can be used in other embodiments.

Register 404 is an M-qubit register, where M is a power of 2. In this case, register 404 stores a 1-qubit reference vector $$q_{in}\left(\text{e.g.}, q_{in} = \begin{bmatrix} \alpha_1 \\ \alpha_2 \end{bmatrix}\right)$$

where $\alpha_1$ and $\alpha_2$ are complex numbers). As will be discussed in greater detail below, reference vector $q_{in}$ can be any qubit on the surface of the Bloch sphere. In some embodiments, $q_{in}$ is selected to include qubits in entangled states to achieve greater compression. In some embodiments, $q_{in}$ includes multiple qubits to provide greater separation of results.

To perform the compression, the reference vector $q_{in}$ is modulated by the unitary matrix U to obtain the compressed output $q_{out\,1}$. In this case, the modulation includes performing a multiplication as follows:

$$q_{out\,1} = U\,q_{in} \quad \text{(equation 2)}$$

In this example, every four parameters of a raw input data vector can be used as control parameters to modulate a 1-qubit reference and be nearly losslessly transformed into a 1-qubit output on a Bloch sphere. The input parameters can be represented using four complex values, and the output can be represented using two complex values. Therefore, a 4-to-2 compression rate is achieved at this stage. Other modulation techniques are described in detail below.

The output is stored in output buffer 410. The process is repeated for each next set of four input values $\alpha=v_5$, $\beta=v_6$, $\gamma=v_7$, $\delta=v_8$ to obtain $q_{out\,2}$; $\alpha=v_9$, $\beta=v_{10}$, $\gamma=v_{11}$, $\delta=v_{12}$ to obtain $q_{out\,3}$; and so on. That is, for every successive set of 4 input values, modulation $q_{out\,j+i}=U\,q_{out\,j}$ is carried out. The outputs ($q_{out\,1}$, $q_{out\,2}$, etc.) are buffered in output buffer 410 and accumulated (added) by accumulator 412 until a final output $q_{out}$ is formed. $q_{out}$ can be displayed, stored, and/or further processed. In this example, the final output $q_{out}$ is a 1-qubit output. Thus, by repeating the process K times on blocks of four inputs and accumulating the results, a compression rate of (K/4):2 is achieved.

Figure 4B:
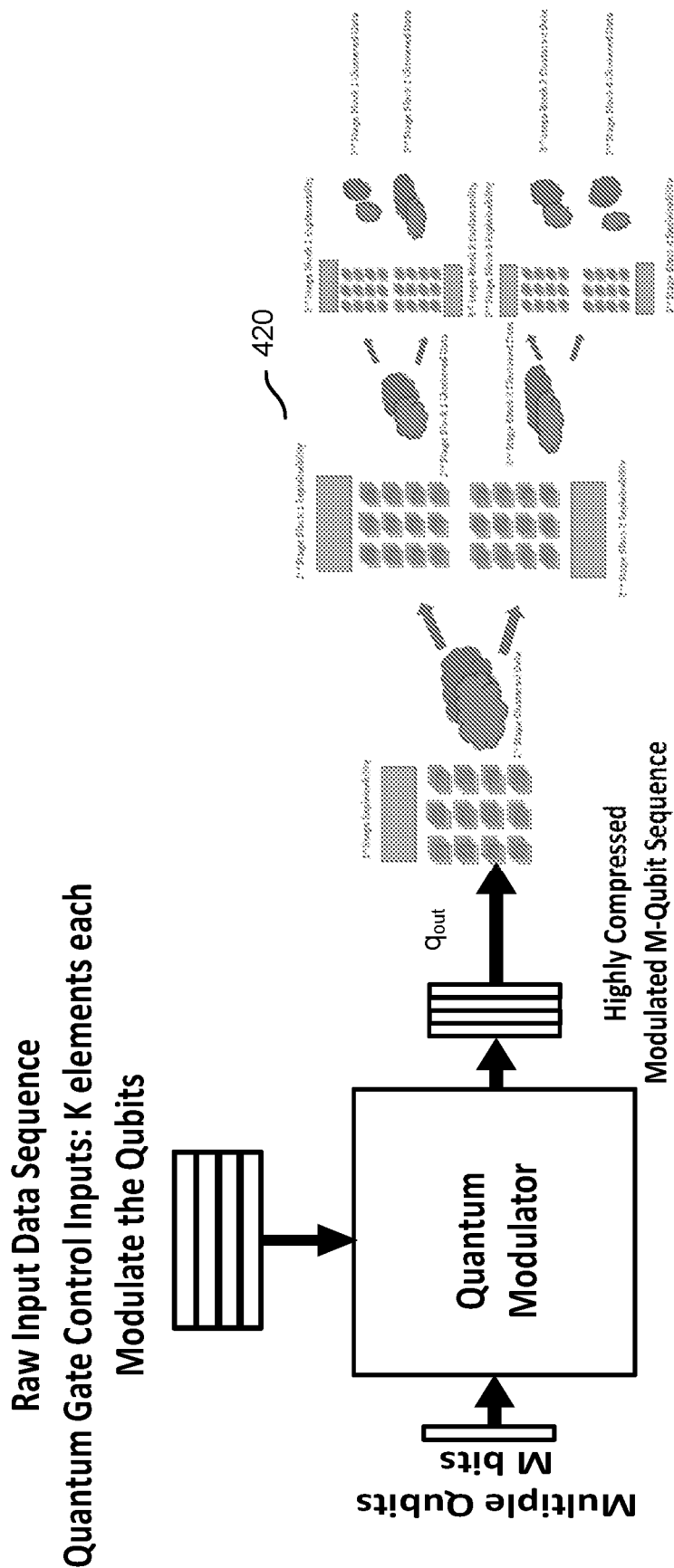
FIG. 4B is a diagram illustrating an embodiment of a system that outputs $q_{out}$ to be further processed.

Various output processing can be performed. FIG. 4B is a diagram illustrating an embodiment of a system that outputs $q_{out}$ to be further processed. In this example, $q_{out}$ is sent to an atomic network 420 to be processed. As shown, atomic network 420 is implemented using the multi-dimensional clustering system described in U.S. Pat. No. 10,521,458, which is incorporated herein by reference for all purposes. Atomic network 420 is configured to identify clusters in its input. Because $q_{out}$ is compressed, the amount of processing to be performed by atomic network 420 is much less than if the original input data (402 of FIG. 4A) is directly sent to the atomic network for clustering. Additionally, because of the reduced number of parameters in each data vector to be processed, the speed of computation of the final prediction, clustering, and other machine learning outputs is accelerated by orders of magnitude.

Figure 4C:
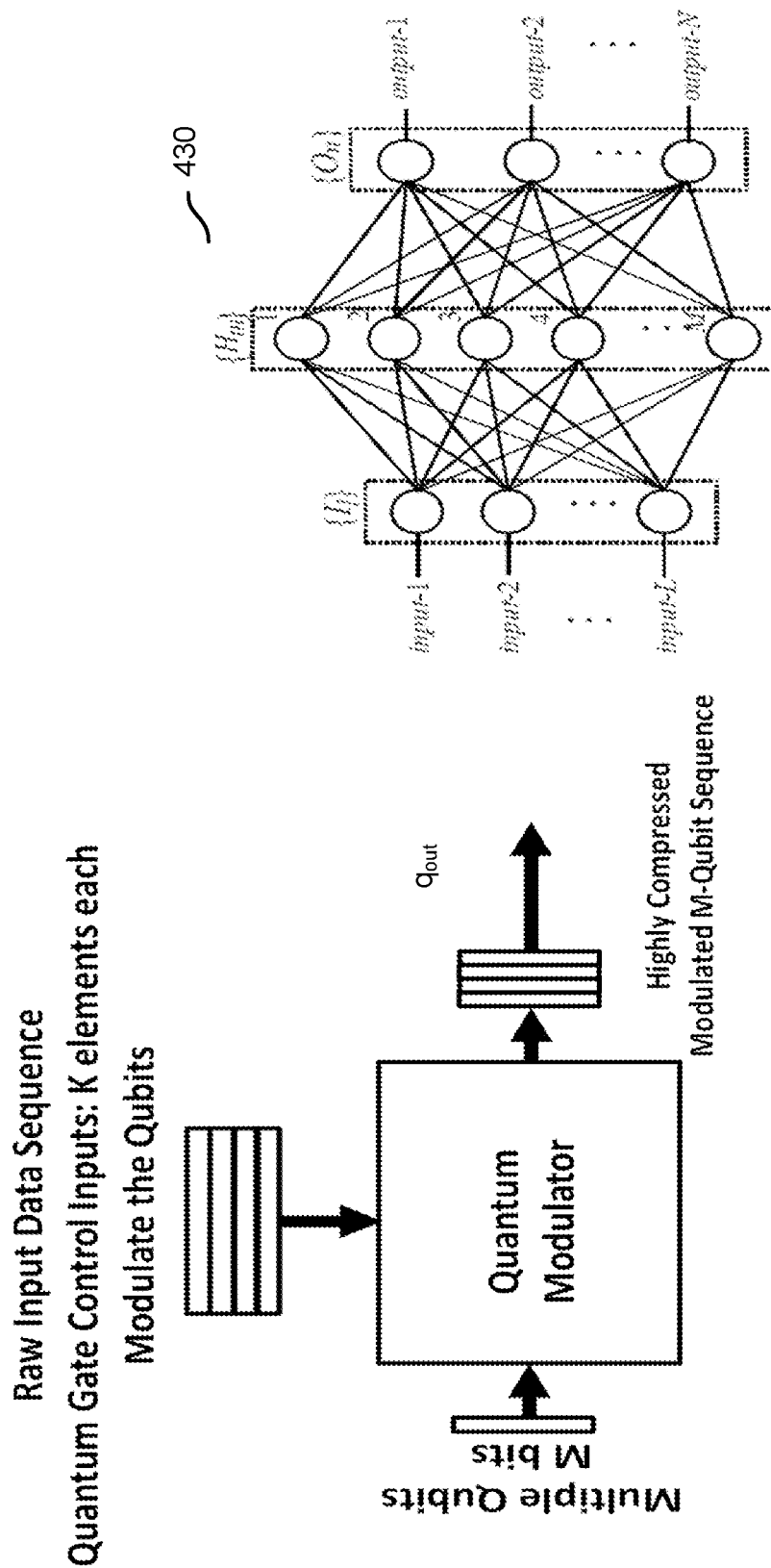
FIG. 4C is a diagram illustrating another embodiment of a system that outputs $q_{out}$ to be further processed.

FIG. 4C is a diagram illustrating another embodiment of a system that outputs $q_{out}$ to be further processed. In this example, $q_{out}$ is sent to a neural network 430 to be classified. Because $q_{out}$ is compressed, the complexity of neural network 430 is significantly less than what would have been required to process the original input data (402 of FIG. 4A). For example, fewer layers and fewer nodes for the neural network are required to process the compressed data than the uncompressed original input. Additionally, because of the reduced number of parameters in each data vector to be processed, the computation speed of the final prediction, clustering, and other machine learning outputs is accelerated by orders of magnitude.

Figure 4D:
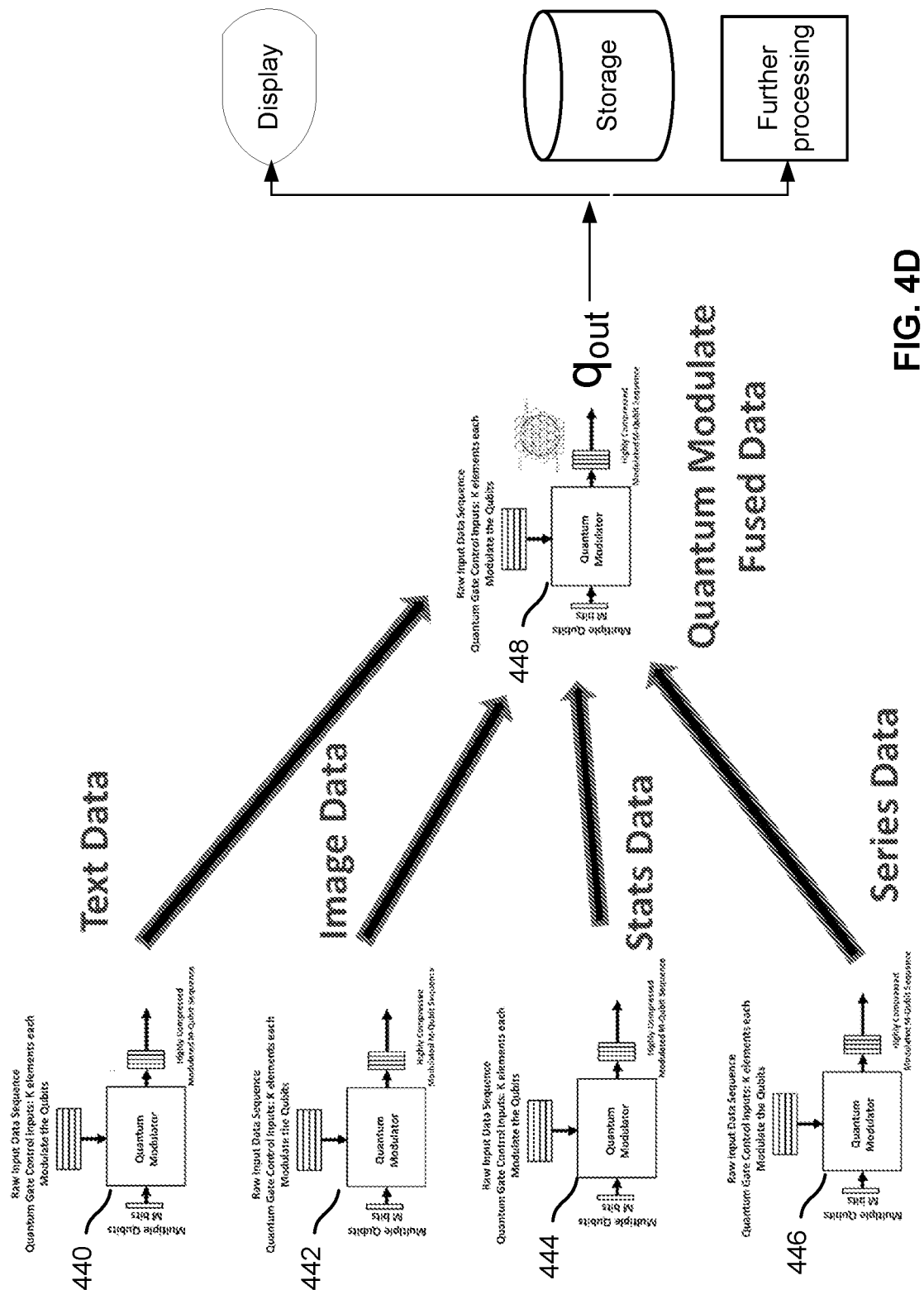
FIG. 4D is a diagram illustrating an embodiment of a system that includes multiple quantum modulation stages.

FIG. 4D is a diagram illustrating an embodiment of a system that includes multiple quantum modulation stages. As shown, related inputs are received from multiple sources such as text, image, statistics, series, etc. Data from each source is vectorized and compressed by a respective first stage quantum modulator (e.g., 440-446) using the technique described above. The compressed outputs are combined and optionally normalized, then sent to a second stage quantum modulator 448 to be further compressed. The output from the second stage quantum modulator $q_{out}$ can be displayed, stored, or further processed by a neural network, an atomic network, a machine learning system, a classifier, or the like.

In some embodiments, the reference vector $q_{in}$ is arbitrarily chosen as a point on the surface of a Bloch sphere. In some embodiments, the reference vector includes qubits that are in entangled states. In other words, the qubits are not independent of each other. Given one qubit value, other qubits in the entangled state can be derived. For example, a reference vector of [0 1 ; 1 0; j 0; 0 -j] includes entangled qubits $\alpha$=[0 1], b=[1 0], c=[j 0], d=[0 -j ], where a and b are symmetric, c is antisymmetric to a, and d is symmetric to c. Other entangled vectors can be generated using known techniques such as what is described in Preparation of Entangled States and Quantum Teleportation with Atomic Qubits by Mark Riebe. When the inputs are modulated with an entangled reference vector, the outputs are also entangled. In other words, given a subset of the output values, the rest of the output values can be derived. For example, when the above entangled reference vector is used, the output includes four qubit values. When projected onto the Bloch sphere, the first and second qubits are symmetric, the first and third qubits are antisymmetric, and the third and fourth qubits are also symmetric. Thus, only one qubit needs to be output, and the remaining three qubits can be derived. This allows for further compression of the modulation result.

Figure 5A:
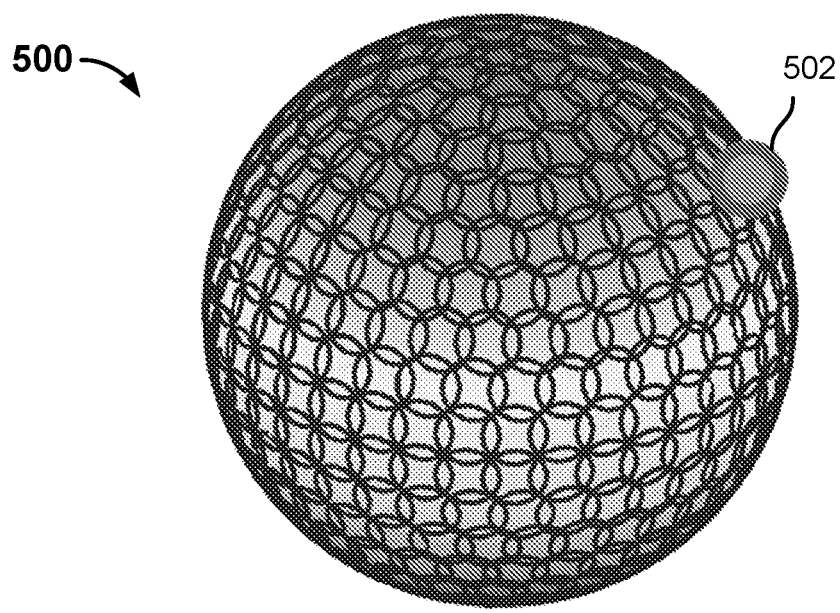
FIG. 5A is a diagram illustrating an example final output of a K-element input.

FIG. 5A is a diagram illustrating an example final output of a K-element input. Here, the K-element input vector is mapped to one dot 502 on Bloch sphere 500.

Different input vectors would map to different outputs. This is because $q_{out}$ can be viewed as a projection of $q_{in}$ by the orthonormal operator U onto a Hilbert space. U is formed by the nonlinear operations in Equation 1 which are rotations in 3-D space, and those rotations are a function of $\alpha$, $\beta$, $\gamma$, and $\delta$, which are taken from the elements of the raw input data vector. Therefore, given a closely related pattern of raw input vectors, they will be mapped into a clustered region of the Hilbert space, and a different closely related pattern of other raw input vectors will be mapped into a separate cluster in a different region of the Hilbert space. In some embodiments, the outputs are displayed to show clustering.

Figure 5B:
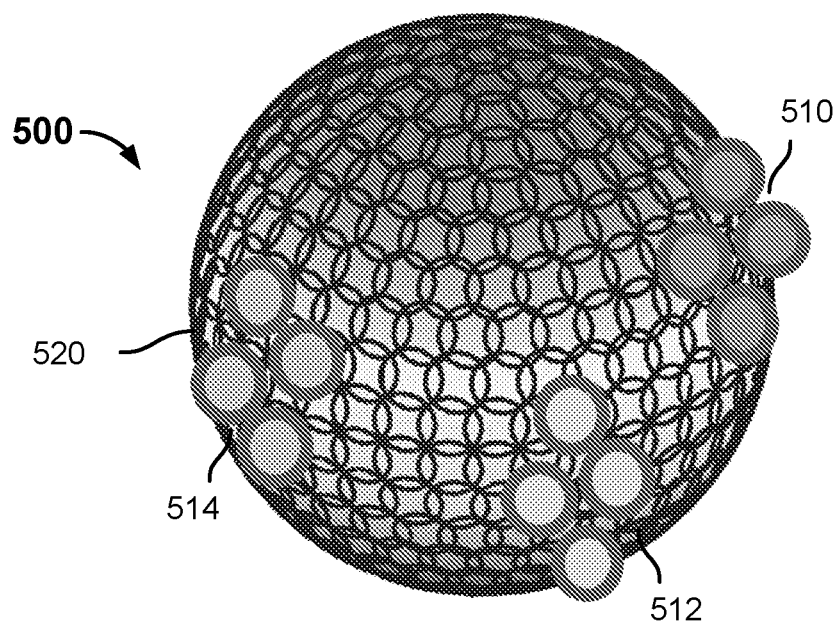
FIG. 5B is a diagram illustrating multiple input vectors being mapped to their corresponding outputs on the Bloch sphere.

FIG. 5B is a diagram illustrating multiple input vectors being mapped to their corresponding outputs on the Bloch sphere. As shown, the outputs are mapped to three distinct clusters 510, 512, and 514 on Bloch sphere 500.

Figure 5C:
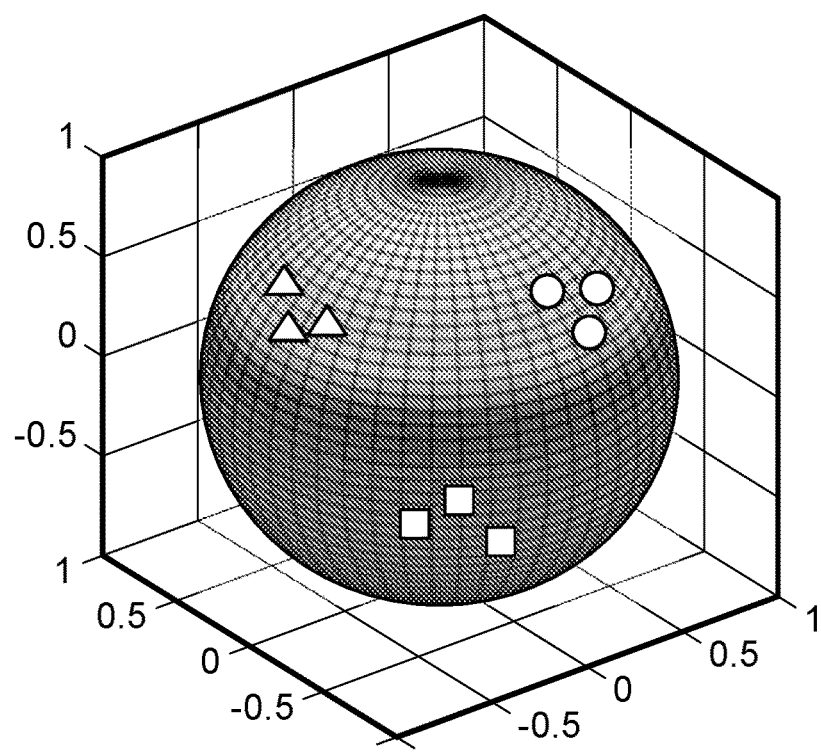
FIG. 5C is a diagram illustrating multiple input vectors being mapped to two Bloch spheres.
Figure 5C:
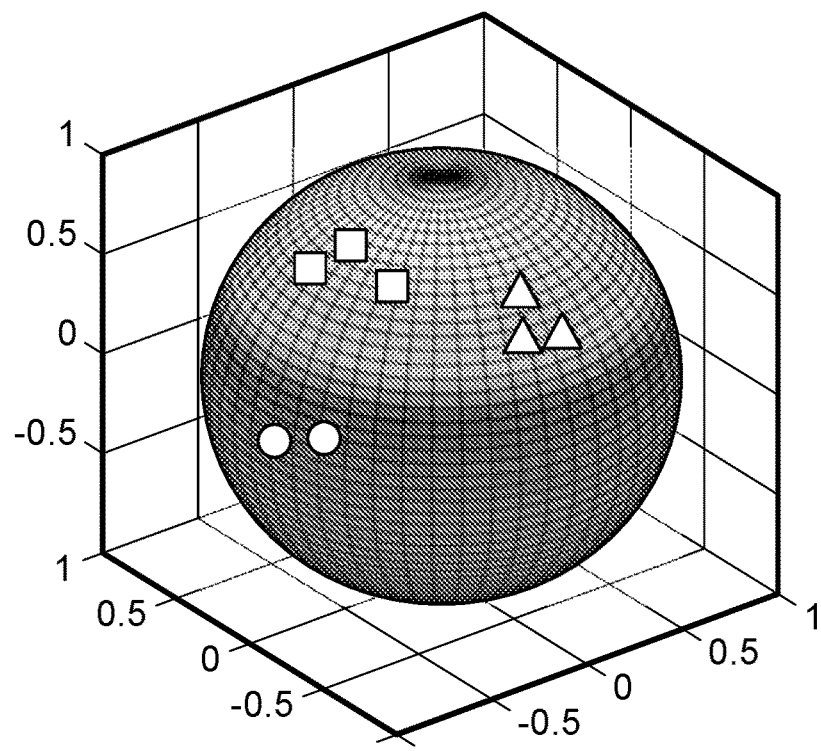

In the implementation above, output data is mapped onto a single Bloch sphere. In some embodiments, the output data is mapped to multiple Bloch spheres (in other words, the outputs include multiple qubits), therefore, there is greater separation between output vectors, and a higher signal to noise ratio is achieved. In principle any length K raw input data vector can be mapped into one qubit, which is basically a complex number represented by a real scalar and an imaginary scalar component. However, in practice, it is often useful to utilize the raw input data vectors to modulate an M-qubit word or register. The higher dimension allows for larger separation distances in the resulting higher dimension Hilbert space. FIG. 5C is a diagram illustrating multiple input vectors being mapped to two Bloch spheres.

In some embodiments, the output can be projected onto a two-dimensional space. When the outputs are mapped onto a greater number of Bloch spheres, the projection will also show greater separation between different clusters of data.

Figure 5D:
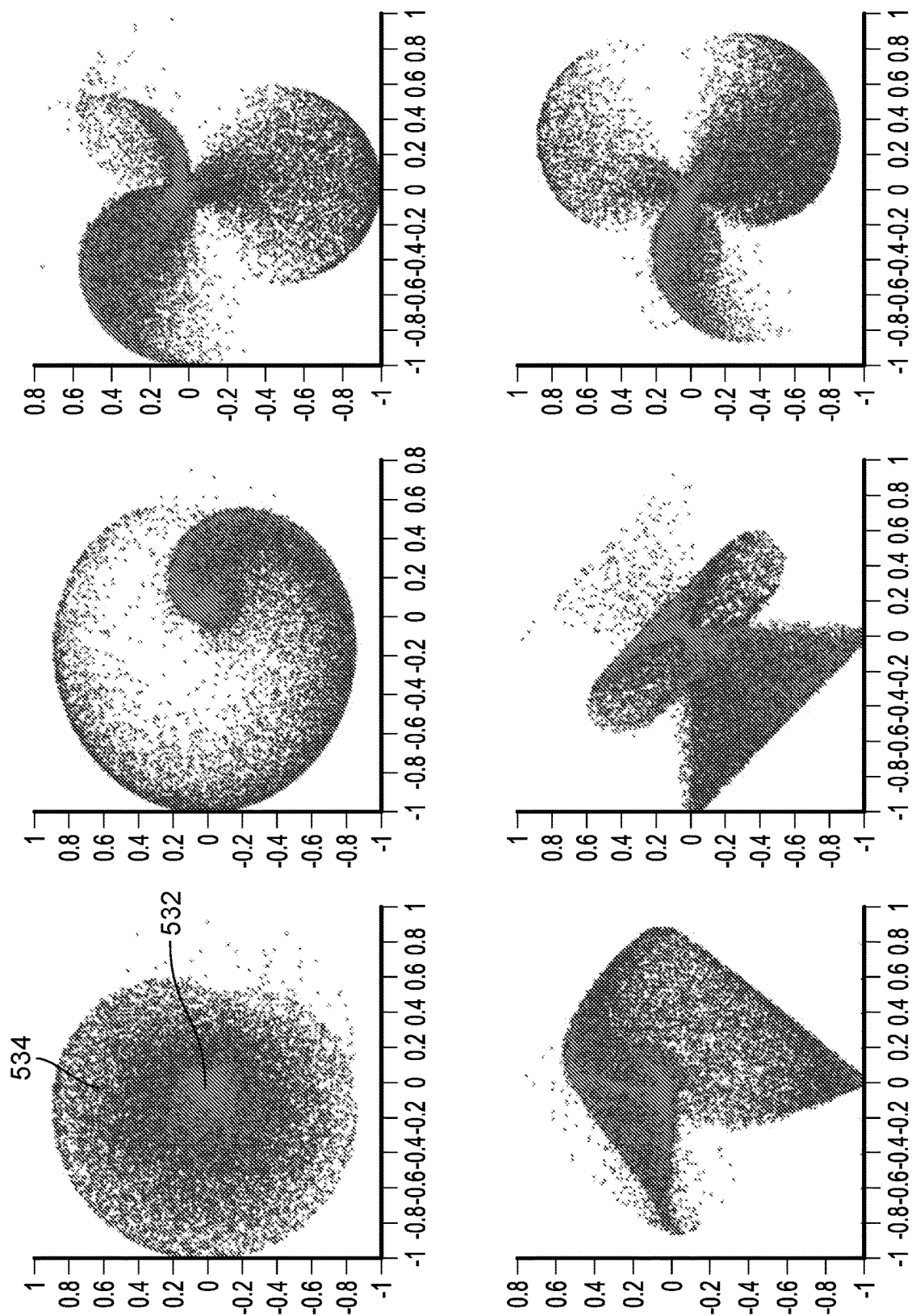
FIGS. 5D-5F are 2-dimensional projections of example outputs.
Figure 5E:
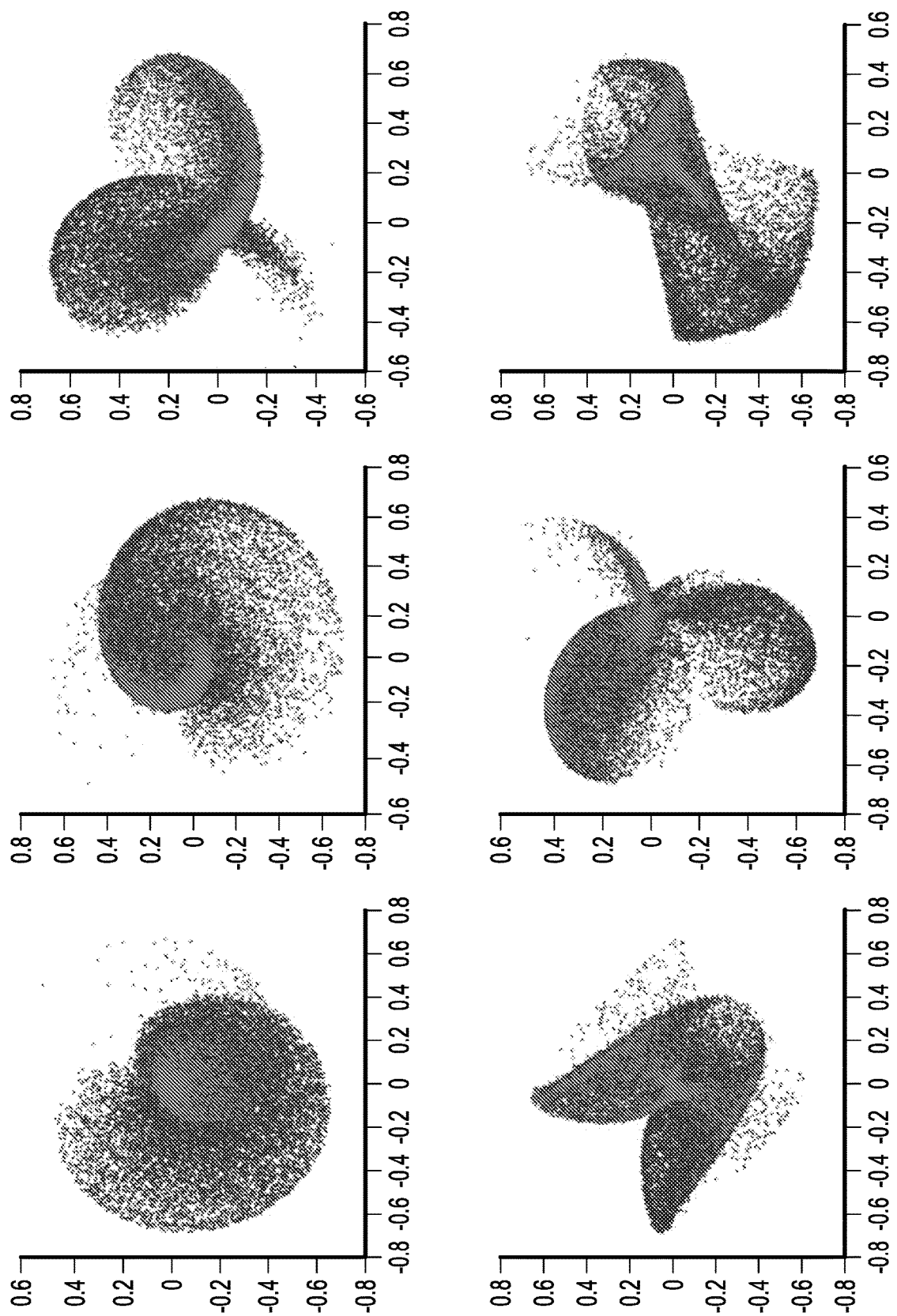
Figure 5F:
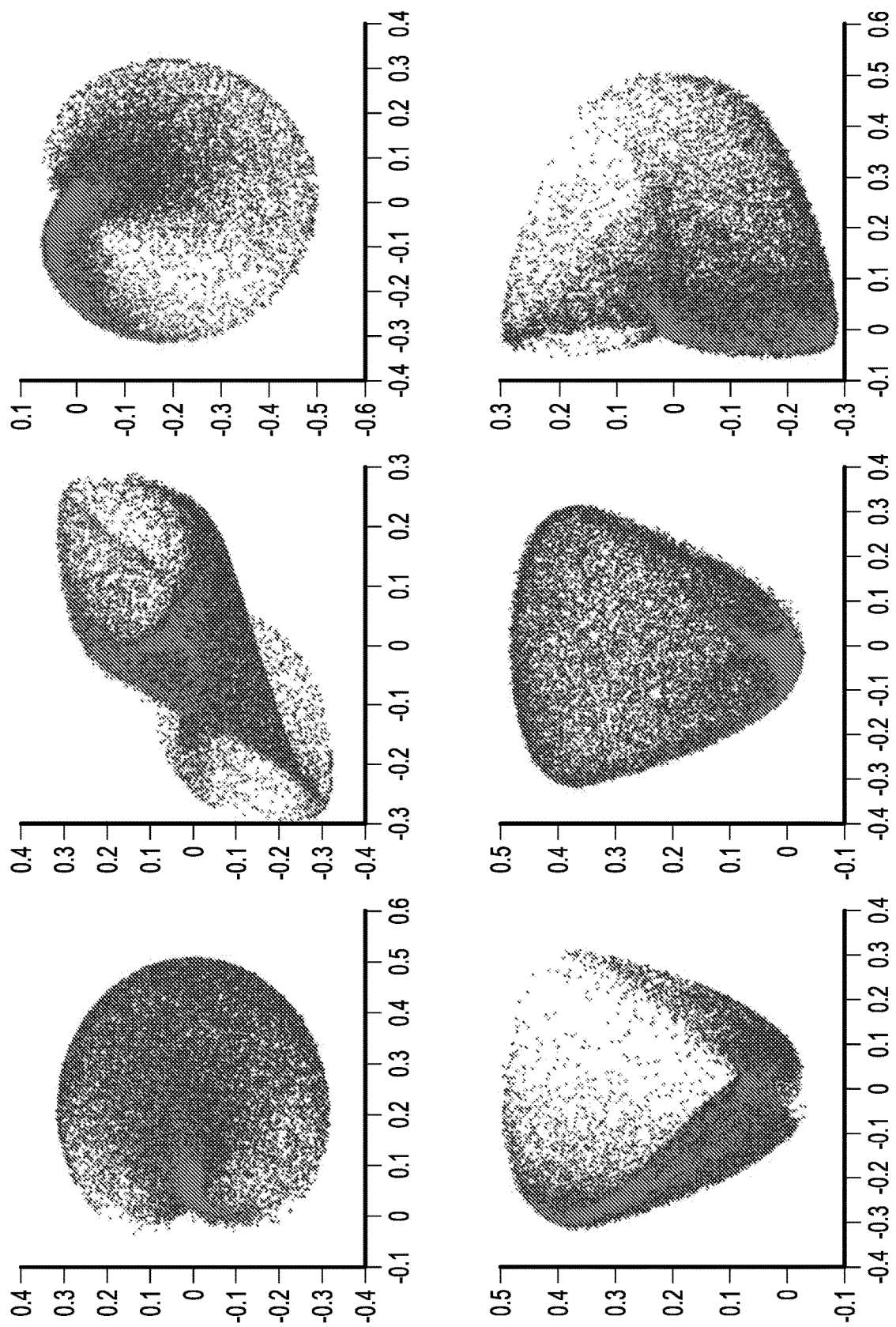

In one example, credit card user data is mapped to Bloch spheres and the results are projected onto a 2-dimensional space. FIGS. 5D-5F are 2-dimensional projections of example outputs. Color 532 (red) corresponds to users that have defaulted and color 534 (blue) corresponds to users that have paid off their cards. In FIG. 5D, the data is mapped to a 2-qubit space and projected onto a 2-dimensional space. In FIG. 5E, the data is mapped to a 4-qubit space and projected onto a 2-dimensional space. In FIG. 5F, the data is mapped to an 8-qubit space and projected onto a 2-dimensional space. Even in 2-dimensional projections, there is greater separation when the data is projected onto a higher qubit space (more Bloch spheres).

Outputs such as FIGS. 5A-5F can be displayed to the user to provide a visual representation of the results. In some embodiments, user interface tools are provided for the user to interact with the outputs, such as zooming or rotating the Bloch sphere or projection, selecting one or more specific qubits to examine their corresponding input properties, etc.

The set of $q_{out}$ vectors are of reduced dimensions relative to the raw input vectors and inherit properties of the raw input vectors, and are clustered in different regions of the Hilbert space. In various embodiments, the compressed output vectors can be sent to a multidimensional Atomic Network configured to perform class separation and clustering, a conventional neural network, a classifier, a machine learning engine, or the like. Since compression greatly reduces the amount of data sent to be further processed, the bandwidth required for uploading the data, the memory/storage required to hold the data, and the computational power required to process the data are also greatly reduced. For example, in some cases involving credit card customers, there are millions of customers each having hundreds of characteristics. Uploading, storing, and processing the data to determine bad, good, or excellent borrower classes can take hours and requires a lot of memory and processing cycles. By compressing the amount of data to be uploaded and processed, the same classification can be made in minutes with much less memory. Furthermore, in some processing applications such as machine learning, neural networks, etc., computation complexity grows exponentially with the number of input parameters. By using the above technique to compress inputs with high numbers of parameters into intermediate results with low numbers of parameters, the computation complexity required to further process the intermediate results and obtain the desired result is greatly reduced. For example, a typical classifier used to classify input data having 1024 parameters would require on the order of $1024^3$ multiplications. Using the above compression technique, the input data can be reduced to a 3-qubit value, which only requires the classifier to perform on the order of $8^3$ multiplications. Furthermore, concomitant with exponential-scale reduction in complexity comes exponential reduction in computation speed and run time.

Now consider for example the following Kronecker product of two 2x2 unitary matrices:

$$U_A = U_1 \otimes U_2$$

where $U_1$ and $U_2$ are 2x2 unitary matrices parameterized by 4 angles each. For example, $\alpha_1$, $\beta_1$, $\gamma_1$, and $\delta_1$ are set to be the first four entries of the input vector respectively, and applied to Equation 1 to obtain $U_1$; $\alpha_2$, $\beta_2$, $\gamma_2$, and $\delta_2$ are set to be the next four entries of the input vector and applied to Equation 1 to obtain $U_2$. Thus, $U_A$ is a 4x4 unitary matrix parametrized by 8 angles (formed by 8 input vector entries). A 2-qubit register (including 4 complex values) $q_{in}$ can be modulated by the 4x4 unitary matrix $U_A$ such that $$q_{out} = U_A q_{in}$$

which means that 8 parameters forming $U_1$ and $U_2$ are used to form the 4-parameter register $q_{out}$, achieving an 8-to-4 compression ratio, or a reduction by 2.

If $q_{out}$ is modulated by another 4x4 unitary matrix $U_B$ that is parametrized by 8 different angles (and formed by the next 8 input vector entries of $U_1$ and $U_2$ according to $U_B = U_1 \otimes U_2$), the following results:

$$q_{out2} = U_B q_{out} = U_B U_A q_{in}$$

which means that $q_{out2}$ is a 2-qubit register (4 complex values) uniquely modulated by 16 parameters, achieving a 16-to-4 compression ratio, or a reduction of 4. This result is consistent with the previous discussion, $q_{out2}$ is a projection of $q_{in}$ by the orthonormal matrix $U_B U_A$ onto the Hilbert space. In theory the process can be repeated ad infinitum, and in principle, a register with a small number of bits can be modulated using a very large number of angle rotations (even just a one-qubit register can hold an infinite amount of information). Performing the compression does require extra processing time but can be done offline.

In the architectures described below, a 4-qubit register (storing 8 complex values) or an 8-qubit register (storing 16 complex values) is modulated with a unitary matrix that is a Kronecker product of three 2x2 unitary matrices (which generates an 8x8 unitary matrix parametrized by 8 angles) or a unitary matrix that is a Kronecker product of four 2x2 unitary matrices (which generates a 16x16 unitary matrix parametrized by 16 angles) respectively. If the latter operation is performed for example, the first 16 elements from the raw data input vector as angles are used to perform that modulation.

Figure 6A:
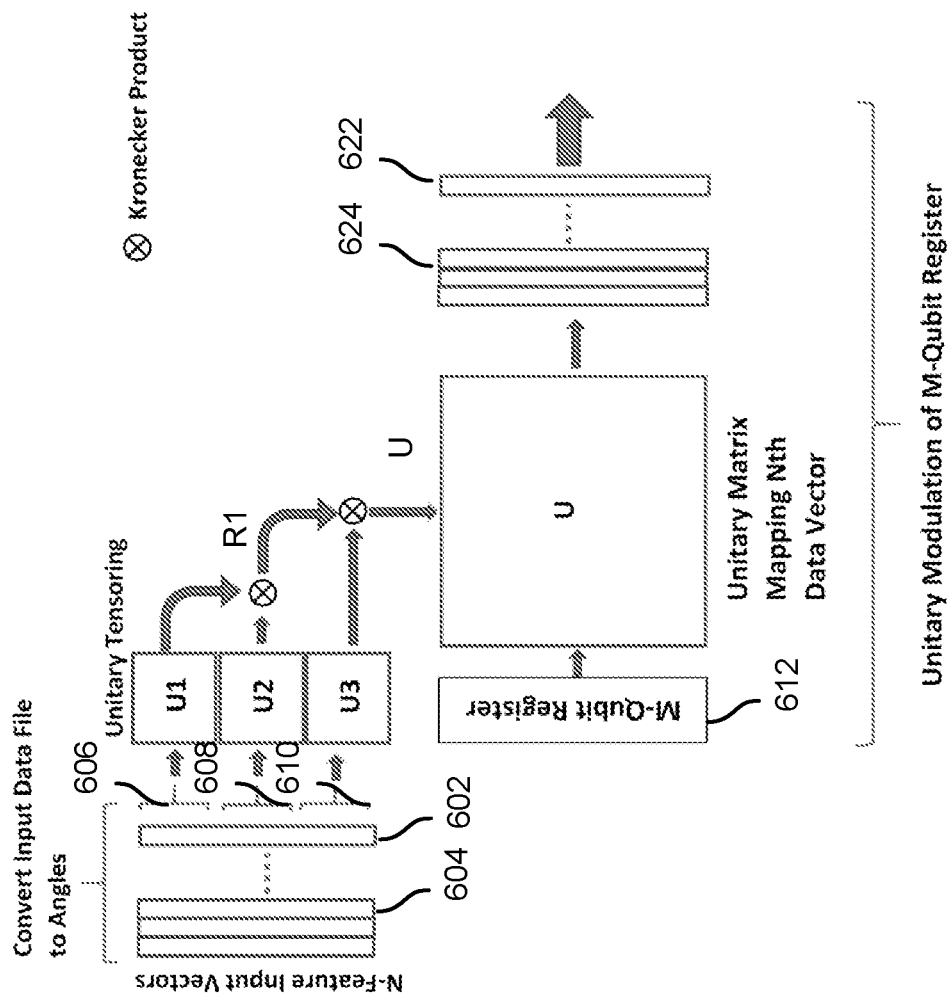
FIG. 6A is a diagram illustrating another embodiment of a system for performing quantum modulation.

FIG. 6A is a diagram illustrating another embodiment of a system for performing quantum modulation. System 600 can be used to implement 400 of FIG. 4A. In this example input vectors are stored in registers 602, 604, etc. Each input vector represents a set of input data with N features, such as the characteristics of an applicant for a service (e.g., age, income, debt level, etc.), the properties of an entity under evaluation (e.g., revenue, debt, number of employees, number of offices, etc.), or the like. Each set of input data is divided into groups of 4 values each. For example, if the input vector has the form of [c1 c2 c3 c4 c5 c6 c7 c8 c9 c10 c11 c12] where ci is a complex number, the input vector is divided into a first vector 606 which includes c1, c2, c3, and c4; a second vector 608 which includes c5, c6, c7, and c8; and a third vector 610 which includes c9, c10, c11, and c12. Each vector includes four (complex) values, which are normalized (according to their respective ranges) and converted to angles between 0-2π and are used as inputs α, β, γ, and δ to equation 1 to form a corresponding 2x2 unitary matrix (also referred to as a unitary tensor) which is stored in a corresponding register. This is also referred to as converting the input into angles. For example, suppose that the range for c1, c2, c3, and c4 is 1-200, then the corresponding $$\alpha, \beta, \gamma, \text{ and } \delta \text{ are} \frac{2\pi c_1}{200}, \frac{2\pi c_2}{200}, \frac{2\pi c_3}{200}, \text{ and} \frac{2\pi c_4}{200},$$

respectively. As shown, c1, c2, c3, and c4 form a unitary tensor U; c5, c6, c7, and c8 form a unitary tensor U2; c9 c10 c11 c12 form a unitary tensor U3, and so on.

As shown, the inputs are encoded to implement a quantum gate matrix U. Specifically, a Kronecker product operation is performed on the first unitary tensor U1 and the second unitary tensor U2 to obtain a Kronecker product R1, which is a 4x4 matrix. Another Kronecker product operation is performed on R1 and the third unitary matrix U3 to obtain another Kronecker product that is an 8x8 matrix. This Kronecker product, U, is used as the quantum gate matrix (also referred to as the unitary matrix) that modulates a reference vector which is stored in register 612. In this example, the reference vector can be a vector having 8 complex number entries that form 4 qubits. The reference vector is modulated by the unitary matrix U to generate outputs that also have 4 qubits each (in other words, the outputs are mapped to 4 Bloch spheres.) In this case, the outputs (in particular, the coefficients of the qubit vectors) are stored in registers 622, 624, etc. The outputs can be displayed, further processed by a neural network, an atomic network, etc.

Figure 6B:
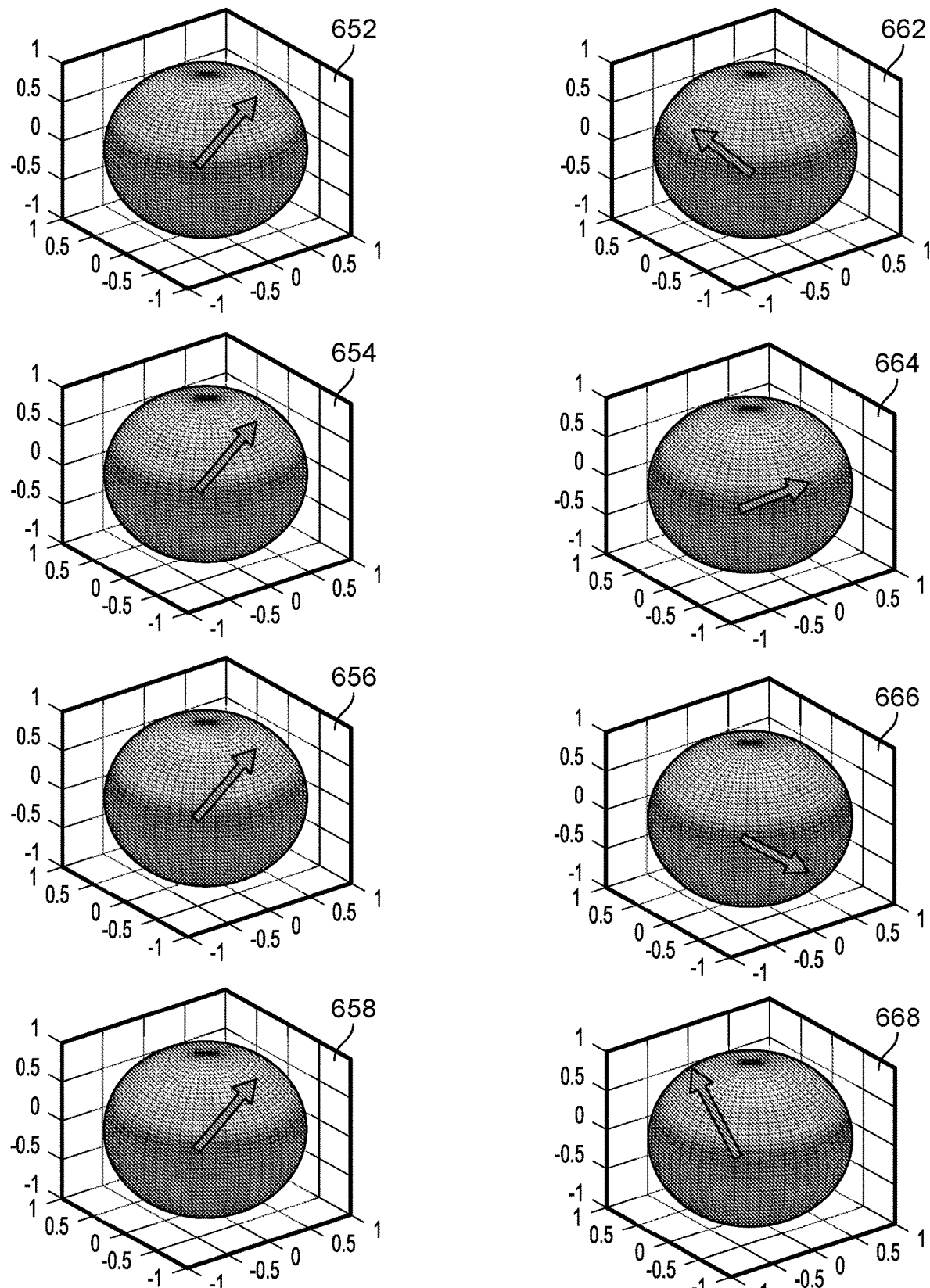
FIG. 6B is a diagram illustrating an example set of input vectors and output vectors.

FIG. 6B is a diagram illustrating an example set of input vectors and output vectors. Four reference input qubits are shown as vectors on Bloch spheres 652-658, and the outputs are mapped to vectors on Bloch spheres 662-668.

Although the example shows that three stages of outputs are used to generate the final unitary matrix U, a different number of stages can be used in other embodiments. In such embodiments, at successive stages, a Kronecker product operation is performed at each stage on the corresponding unitary matrix and the output from the previous stage, until a final unitary matrix is generated.

In this example, an input vector has N feature values. As shown, N=12, and the values are compressed into an output of 8 values (for a total of 4 qubits). If the input vector has a greater number of values, in some embodiments, the values can be divided into segments and processed. For example, if the input vector has 36 values, the values can be segmented into a first segment comprising the first N=12 values, a second segment comprising the next 12 values, and a third segment comprising the last 12 values. Each segment is divided into three groups of four values and modulated as shown above, and the results from the input segments are summed to generate the final result. Padding can be used to ensure that the number of values is a multiple of N. In some embodiments, the system is expanded to accommodate input vectors with greater numbers of feature values.

Figure 7:
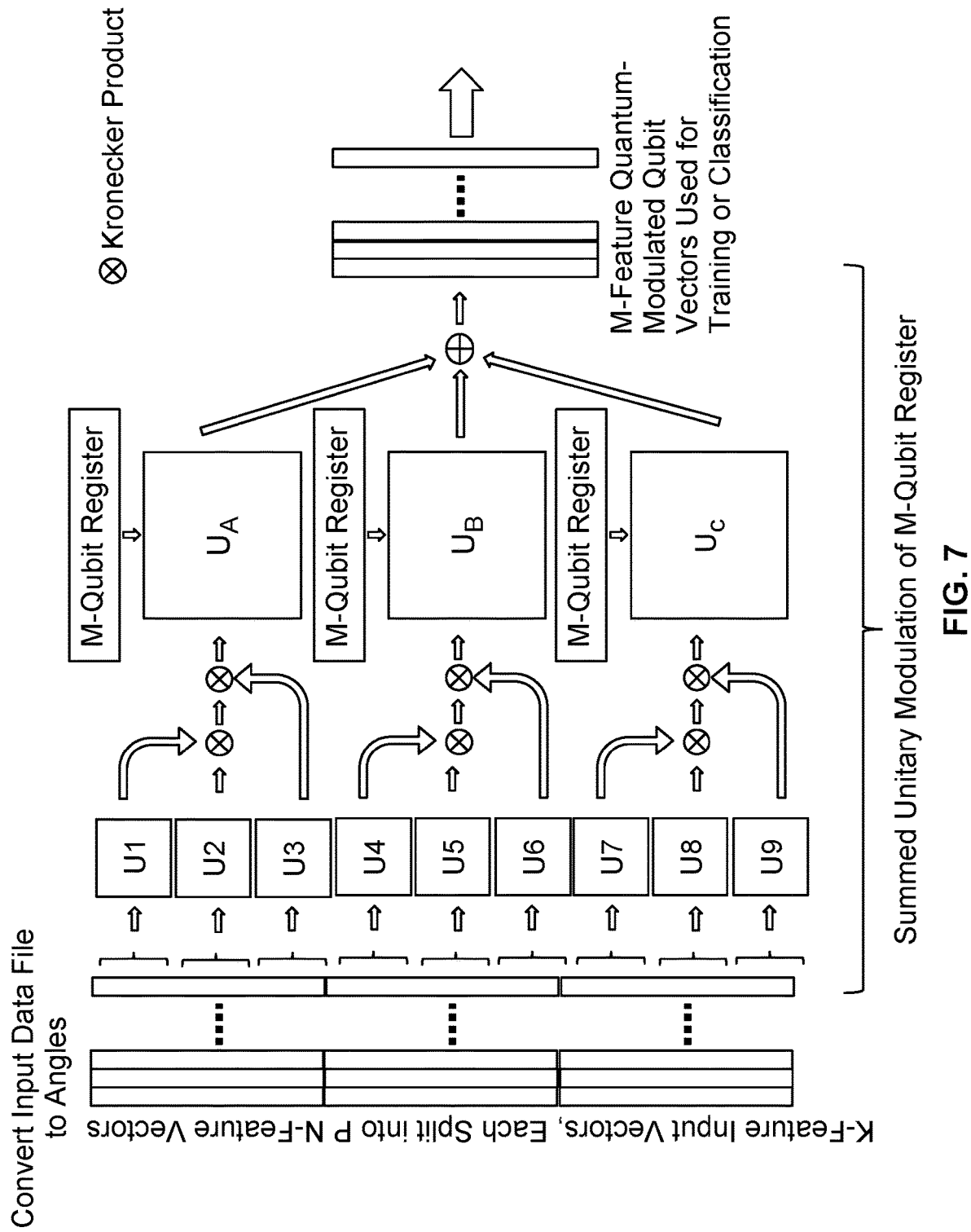
FIG. 7 is a block diagram illustrating another embodiment of a system for performing quantum modulation.

FIG. 7 is a block diagram illustrating another embodiment of a system for performing quantum modulation. System 700 is expanded to accommodate input vectors with P N feature values, where P is a natural number. As shown, P=3, and the input vector is divided into 3 sections. Similar to system 600 of FIG. 6, the unitary matrices are formed by groups of four feature values that are normalized and converted to angles between 0-2π and are used as inputs α, β, γ, and δ to equation 1 to form a corresponding 2x2 unitary matrix which is stored in a corresponding register. For example, the first four values of the input vector form U1, the next four values form U2, the next four values form U3, and so on, until all 36 values are used and 9 unitary matrices U1-U9 are formed.

Kronecker product operations are performed on subsets of unitary tensors to form unitary matrices. In particular, Kronecker product operations are performed on groups of three unitary tensors. For example, a first Kronecker product operation is performed on U1 and U2, and a second Kronecker product operation is performed on the result and U3 to generate unitary matrix $U_A$. Similarly, unitary matrices $U_B$ and $U_C$ are generated. M-qubit reference vectors are modulated using their respective unitary matrices, and the results are summed to generate M-feature qubit vectors as outputs. The outputs can be displayed, further processed by a neural network, an atomic network, etc.

In the above examples, the encoding and modulation according to Equation 2 includes multiplying the quantum gate matrix and the reference qubit vector. Other encoding and modulation techniques can be used, several of which are described in embodiments below. Some of the embodiments are input sequence-dependent, which means that the input data having the same content but in different sequence will be mapped to different locations on the Bloch sphere, thus making such techniques more suitable for sequence-dependent applications such as searches where the sequence of terms in the search phrase matters. Some of the embodiments are sequence-independent, which means that the input data having the same content but in a different sequence will be mapped to the same location on the Bloch sphere. Such techniques are more suitable for sequence-independent applications such as searches for specific content/terms in the search phrase (although not necessarily in the same sequence).

Embodiment 1

$$q_{out} = \ldots U_G \ldots U_B U_A \, q_{in}$$

$q_{out}$ is the result of consecutive rotations of the input qubit $q_{in}$. In some embodiments, $U_A, U_B, \ldots U_G, \ldots$ are unitary tensors generated by applying subsets of (normalized) input vector entries to a unitary matrix. For example, let $\alpha = v_1$, $\beta = v_2$, $\gamma = v_3$, and $\delta = v_4$, then apply the parameters to the unitary matrix U of equation 1. In some embodiments, to generate $U_A, U_B, \ldots, U_G, \ldots$, the unitary tensors are first created based on subsets of input vector entries, and Kronecker products are applied in a manner similar to FIG. 7. Although $U_A, U_B, \ldots, U_G, \ldots$ are referred to in this example, the actual number of unitary tensors generated depends on implementation.

Note that in this embodiment, if four elements are used at a time from the raw input data vector to form a unitary tensor $U_j$, then the result of the final rotated vector $q_{out}$ is dependent on the order the elements are selected from the raw input data vector. In other words, this encoding and modulation technique is input sequence-dependent. This is because according to Equation 1, the rotations are along different axes, and therefore the final position of each $q_{out}$ does depend on which raw input data vector element rotates the qubit along which axis.

Here the quantum gate $U = U_G \ldots U_B U_A$ is reversible because it is unitary and has an inverse $U'$ which means $q_{in} = U' \, q_{out}$.

Embodiment 2

$$q_{out} = \cdots + U_G q_{in} + \quad . \quad . \quad . \quad + U_B q_{in} + U_A q_{in} = (\ldots + U_G + \ldots + U_B + U_A) \, q_{in}$$

Here $U_A, U_B, U_C$, etc. can be generated using the same techniques as described above in connection with Embodiment 1. $q_{out}$ is the result of linear superposition of individual rotations of the reference vector $q_{in}$.

In this embodiment, if one element is used at a time from the raw input data vector to modulate each $U_j$, the result of the final rotated vector $q_{out}$ is independent on the order that the elements are selected from the raw input data vector. This is because Equation 1 is restricted to be $$\begin{bmatrix} \cos(\gamma/2) & -\sin(\gamma/2) \\ \sin(\gamma/2) & \cos(\gamma/2) \end{bmatrix}$$

by setting $\alpha$, $\beta$, and $\delta$ to 0, the rotations are along different axes, and therefore the final position of each $q_{out}$ does not depend on which raw input data vector element rotates the qubit along which axis.

Here each $U_i$ is reversible because it is unitary and its inverse is $U'_i$, therefore each $U_i$ is full-rank, therefore $(\ldots + U_G + \ldots + U_B + U_A)$ is full rank and invertible and can be used to recover the inputs as follows:

$$q_{in} = (\ldots + U_G + \ldots U_B + U_A)^{-1} q_{out}$$

Embodiment 3

$$q_{out} = \ldots + U_G \ldots U_B U_A \, q_{in} + \ldots + U_c U_B U_A \, q_{in} + U_B U_A \, q_{in} + U_A \, q_{in}$$

Here $U_A, U_B, U_c$, etc. can be generated using the same techniques as described above in connection with Embodiment 1. This encoding and modulation technique is input sequence-dependent.

Embodiment 4

$$q_{out1} = U_A \, q_{in}$$

$$q_{out2} = U_B \, U_A \, q_{in} + U_A \, q_{in}$$

$$q_{out3} = U_C \, U_B \, U_A \, q_{in} + U_B \, U_A \, q_{in} + U_A \, q_{in}$$

etc.

This encoding and modulation technique provides multiple outputs and is input sequence-dependent.

In some embodiments, an input vector with K elements is mapped into a single output qubit on a Bloch sphere, as shown in FIG. 5A. Multiple input vectors can be mapped to multiple qubits as shown in FIG. 5B. The distance between outputs resulting from different input vectors can be computed to determine how closely related the two different input vectors are. This allows classification to be performed directly by comparing the distances and without requiring the use of a classifier. Referring to FIG. 5B for an example, the outputs in cluster 514 will have shorter distances relative to each other (or a known reference vector such as 520) than the outputs in cluster 510.

In another example, assume there are two sets of input vectors, each defining the behaviors of one of two segments of a population, and each having N1 and N2 vectors respectively, then mapping all those vectors into a sequence of N1+N2 one-qubit vectors, each of which represents a location or orientation of a vector on the Bloch Sphere, is equivalent to generating a compressed version of each of the sequences of the raw input data vectors. If the two populations are indeed endowed with different behaviors, then the mapped sequences of N1 and N2 qubits inherit the distinguishing properties of those two populations. The qubit sequences can be fed into a neural network, a classifier, and/or an atomic network, and a classification/clustering of the two populations can be easily obtained.

Further, compression reduces the amount of processing for later stages. For example, suppose initially the input data includes large vectors of K elements each, and for L vectors the number of entries to be processed will be KxL. With the compression described above, qubits each of length 2 are modulated, resulting in matrices that are size 2xL that are fed into a neural net, a classifier, or an Atomic Network. This is even more pronounced in the following scenarios: previously, to process a multidimensional problem would have required a geometric expansion of KxK matrices, but with compression, the processing only requires a geometric expansion of 2x2 or 4x4 or 8x8 matrices, resulting in a significant reduction in complexity and processing requirements. Second, when processing multi-fused data in which data from several disciplines is input into a machine learning mechanism and conclusions/actions are generated, the compression technique also reduces the processing requirement.

Figure 8:
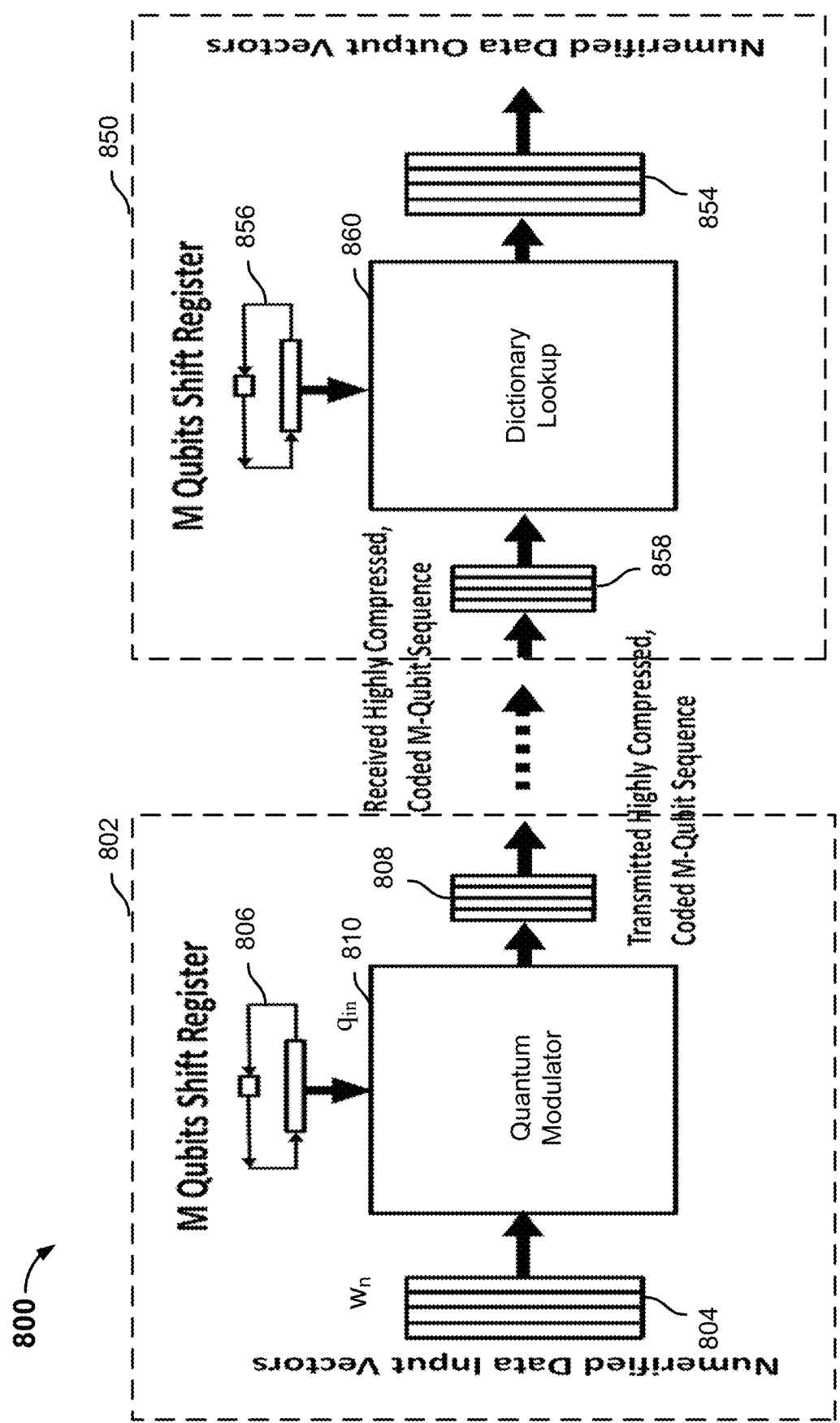
FIG. 8 is a block diagram illustrating an embodiment of a quantum modulation-based system that is used for cryptography.

FIG. 8 is a block diagram illustrating an embodiment of a quantum modulation-based system that is used for cryptography. In this example, 800 is the encoder and 850 is the decoder. Data to be encoded is first converted into numerical vector form and input through register 804.

Quantum modulator 810 and shift register 806 are used to perform encryption. The modulation of the elements should be based on a sequence-dependent technique (e.g., quantum modulation embodiment 4 above) rather than on a sequence-independent technique (e.g., quantum modulation embodiment 2 above). This is because the reverse decryption process must recover the original processed sequence of elements and not just the elements themselves.

In this example, the N-element raw input data vector is denoted by:

$$w_n = \begin{bmatrix} w_{1n} \\ \vdots \\ w_{Mn} \end{bmatrix}$$

where $w_{k\ n}$ are L-element sub-vectors of $w_n$, and k=1, . . . ,M,

Each $w_n$ is used to generate a reversible quantum unitary matrix gate U that modulates a qubit register 806 according to quantum modulation embodiment 4 described above. This is intended to generate a mapping on the Bloch Sphere that is unique to the particular sequence in $w_n$. One assumption in this example is that the data being encrypted belongs to a fixed discrete known finite "alphabet." This guarantees the design of mapping unitary matrices that can map every unique sequence in $w_n$ to a unique and fixed point in the Bloch Sphere.

Let $w_{1\ n}$ generate $U_A$ $w_{2\ n}$ generate $U_B$ $w_{3\ n}$ generate $U_C$ etc . . .

and choose a reference qubit register $q_{in}$ of length L/2 qubits (i.e., L bits). Set up the modulator to perform the following modulation:

$q_{out1} = U_A\ q_{in}$ $q_{out2} = U_B\ U_A\ q_{in} + U_A\ q_{in}$ $q_{out3} = U_C\ U_B\ U_A\ q_{in} + U_B\ U_A\ q_{in} + U_A\ q_{in}$

. . .

$q_{out\ n} = \ldots + U_D U_C\ U_B\ U_A\ q_{in} + U_C\ U_B\ U_A\ q_{in} + U_B\ U_A\ q_{in} + U_A\ q_{in} = (\ldots + U_D U_C\ U_B\ U_A + U_C\ U_B\ U_A + U_B\ U_A + U_A)\ q_{in}$ where $q_{out\ n}$ is a length L vector that is a mapped on the Bloch Sphere and that uniquely corresponds to the sequence of elements in vector $w_n$.

Because of the assumption that $w_n$ is formed from a finite fixed known alphabet, all the mappings on the Bloch Sphere correspond to having a compressed code book/dictionary that stores all the possible combinations of $w_n$.

To make the encryption result less predictable, $q_{in}$ is varied for different $w_n$. In this example, a shift register is used to vary the bit pattern of $q_{in}$ for each $w_n$. Other techniques for scrambling/randomizing $q_{in}$ can be used in other embodiments. The initial state of $q_{in}$ and how it varies over time is known to the decoder.

At decoder 850, the knowledge of the qubit used in the mapping of $q_{in}$ is the key to deciphering or reversing the received vector $q_{out\ n}$. Given $q_{in}$ and the fixed alphabet, it is possible to generate a reverse code book/reverse dictionary of output qubits $q_{out\ n}$ to input $w_n$ by applying the modulation technique to all possible combinations of values for $w_n$ and the given $q_{in}$. Upon receiving the encoded message, for a known $q_{in}$, the original message $w_n$ can be looked up in the reverse code book/reverse dictionary using the received vector $q_{out\ n}$.

System 800 or a similar system can be used for data compression/decompression or error correction applications.

In an embodiment where the system is used for a data compression/decompression application, 802 is the compression side, which compresses the input data and transmits the compressed data over a medium to 850, the decompression side. The modulator should also employ an ordered modulation technique (e.g., embodiment 4) to ensure the order of the data being compressed. Further, $q_{in}$ can be fixed and the use of a shift register to change $q_{in}$ is not required.

In an embodiment where the system is used for an error correction application, 802 is the encoder side, which encodes the data with an error correction portion and transmits the encoded data to 850, the decoder side. The modulator should also employ an ordered modulation technique (e.g., embodiment 4) to ensure the order of the data being encoded. The message being encoded includes a residual vector, which corresponds to a function of the input data being encoded (e.g., a checksum or remainder). The residual vector is used to generate a unitary matrix $U_k$ used by the modulator. Assuming that the input has a fixed alphabet, there would be a one-to-one mapping of input to output. At the decoding side, if the received $q_{out\ n}$ is not one of the finite expected points on the Bloch Sphere, then an error in the message is identified and flagged. The message that is decoded includes the residual vector. Depending on the design of the code, errors up to a certain limit are corrected according to conventional error correcting techniques such as forward error correction. Error corrected data that is encoded this way requires less bandwidth for transmission than unencoded data.

Quantum modulation-based data compression has been disclosed. By using the technique described above, classical non-quantum computers can be used to perform qubit-based data processing to compress input data to save memory/storage, reduce computational complexity, and improve performance.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    inputting data comprising a vector that requires a first amount of memory;
    compressing the vector into a compressed representation while preserving information content of the vector, including:
        encoding, using one or more non-quantum processors, at least a portion of the vector to implement a quantum gate matrix; and
        modulating a reference vector using the quantum gate matrix to generate the compressed representation, wherein the compressed representation requires a second amount of memory that is less than the first amount of memory; and
    outputting the compressed representation to be displayed, stored, and/or further processed.

2. The method of claim 1, wherein the compressed representation is mapped on a Bloch Sphere.

3. The method of claim 1, wherein the reference vector includes a qubit.

4. The method of claim 1, wherein the reference vector includes a plurality of qubits in entangled states.

5. The method of claim 1, wherein the encoding of the at least portion of the vector to implement the quantum gate matrix includes applying at least the portion of the vector to a unitary matrix.

6. The method of claim 1, wherein the encoding of the at least portion of the vector to implement the quantum gate matrix includes applying the at least portion of the vector to a unitary matrix $$U = e^{-j\alpha/2} \begin{bmatrix} e^{-j\beta/2} & 0 \\ 0 & e^{-j\beta/2} \end{bmatrix} \begin{bmatrix} \cos(\gamma/2) & -\sin(\gamma/2) \\ \sin(\gamma/2) & \cos(\gamma/2) \end{bmatrix} \begin{bmatrix} e^{-j\delta/2} & 0 \\ 0 & e^{-j\delta/2} \end{bmatrix}.$$

7. The method of claim 1, wherein the encoding of the at least portion of the vector to implement the quantum gate matrix includes:
applying subsets of the vector's entries to a unitary matrix to form a plurality of unitary tensors; and
performing Kronecker product operations.

8. The method of claim 1, wherein the encoding and modulating are input sequence-dependent.

9. The method of claim 1, wherein the compressed representation is sent to a decoder to be decrypted.

10. The method of claim 1, wherein the compressed representation is transmitted over a medium to be decompressed.

11. The method of claim 1, wherein the compressed representation is used in error correction.

12. The method of claim 1, wherein the compressed representation is output to one or more of: a neural network, a classifier, and/or an atomic network.

13. A system, comprising:
one or more processors configured to:
input data comprising a vector that requires a first amount of memory;
compress the vector into a compressed representation while preserving information content of the vector, including to:
encode, using one or more non-quantum processors, at least a portion of the vector to implement a quantum gate matrix; and
modulate a reference vector using the quantum gate matrix to generate the compressed representation, wherein the compressed representation requires a second amount of memory that is less than the first amount of memory; and
output the compressed representation to be displayed, stored, and/or further processed; and
one or more memories coupled to the one or more processors and configured to provide the one or more processors with instructions.

14. The system of claim 13, wherein the compressed representation is mapped on a Bloch Sphere.

15. The system of claim 13, wherein the reference vector includes a qubit.

16. The system of claim 13, wherein the reference vector includes a plurality of qubits in entangled states.

17. The system of claim 13, wherein to encode the at least portion of the vector to implement the quantum gate matrix includes to apply at least the portion of the vector to a unitary matrix.

18. The system of claim 13, wherein to encode the at least portion of the vector to implement the quantum gate matrix includes to apply the at least portion of the vector to a unitary matrix $$U = e^{-j\alpha/2} \begin{bmatrix} e^{-j\beta/2} & 0 \\ 0 & e^{-j\beta/2} \end{bmatrix} \begin{bmatrix} \cos(\gamma/2) & -\sin(\gamma/2) \\ \sin(\gamma/2) & \cos(\gamma/2) \end{bmatrix} \begin{bmatrix} e^{-j\delta/2} & 0 \\ 0 & e^{-j\delta/2} \end{bmatrix}.$$

19. The system of claim 13, wherein to encode the at least portion of the vector to implement the quantum gate matrix includes to:
apply subsets of the vector's entries to a unitary matrix to form a plurality of unitary tensors; and
perform Kronecker product operations.

20. The system of claim 13, wherein the encoding and modulating are input sequence-dependent.

21. The system of claim 13, wherein the compressed representation is sent to a decoder to be decrypted.

22. The system of claim 13, wherein the compressed representation is transmitted over a medium to be decompressed.

23. The system of claim 13, wherein the compressed representation is used in error correction.

24. The system of claim 13, wherein the compressed representation is output to one or more of: a neural network, a classifier, and/or an atomic network.

* * * * *